United States Patent
Kim et al.

(10) Patent No.: US 7,994,003 B2
(45) Date of Patent: Aug. 9, 2011

(54) NONVOLATILE MEMORY DEVICE AND METHOD OF FABRICATING THE SAME

(75) Inventors: Byong-Ju Kim, Suwon-si (KR); Sun-Jung Kim, Yongin-si (KR); Zong-Liang Huo, Suwon-si (KR); Jun-Kyu Yang, Seoul (KR); Seon-Ho Jo, Gimhae-si (KR); Han-Mei Choi, Seoul (KR); Young-Sun Kim, Suwon-si (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 201 days.

(21) Appl. No.: 12/382,646

(22) Filed: Mar. 20, 2009

(65) Prior Publication Data
US 2009/0239367 A1  Sep. 24, 2009

(30) Foreign Application Priority Data
Mar. 21, 2008 (KR) .................. 10-2008-0026489

(51) Int. Cl.
*H01L 21/336* (2006.01)

(52) U.S. Cl. . 438/261; 438/257; 438/591; 257/E21.422; 257/E21.662; 257/E21.68

(58) Field of Classification Search .................. 438/257, 438/261, 591; 257/315, E21.422, E21.423, 257/E21.662, E21.68
See application file for complete search history.

(56) References Cited

U.S. PATENT DOCUMENTS

| | | | |
|---|---|---|---|
| 2005/0280069 A1* | 12/2005 | Mizushima et al. | 257/314 |
| 2006/0073660 A1* | 4/2006 | Joo | 438/266 |
| 2007/0004154 A1 | 1/2007 | Hong et al. | |
| 2007/0108505 A1 | 5/2007 | Seol et al. | |
| 2009/0001443 A1* | 1/2009 | Krishnamohan et al. | 257/316 |
| 2009/0045455 A1* | 2/2009 | Seol et al. | 257/324 |

FOREIGN PATENT DOCUMENTS

| | | |
|---|---|---|
| JP | 2007-134720 A | 5/2007 |
| KR | 10-2007-0001454 A | 4/2007 |
| KR | 10-2007-0050657 A | 5/2007 |
| KR | 10-0753079 B1 | 8/2007 |
| KR | 1020050117944 * | 8/2007 |

\* cited by examiner

*Primary Examiner* — Michael S Lebentritt
*Assistant Examiner* — Daniel Whalen
(74) *Attorney, Agent, or Firm* — Lee & Morse, P.C.

(57) ABSTRACT

A method of fabricating a nonvolatile memory device includes forming a tunnel insulating layer on a semiconductor substrate, forming a charge storage layer on the tunnel insulating layer, forming a dielectric layer on the charge storage layer, the dielectric layer including a first aluminum oxide layer, a silicon oxide layer, and a second aluminum oxide layer sequentially stacked on the charge storage layer, and forming a gate electrode on the dielectric layer, the gate electrode directly contacting the second aluminum oxide layer of the dielectric layer.

9 Claims, 13 Drawing Sheets

NONVOLATILE MEMORY DEVICE AND METHOD OF FABRICATING THE SAME

BACKGROUND OF THE INVENTION

1. Field of the Invention

Example embodiments relate to a memory device and a method of fabricating the same. More particularly, example embodiments relate to a nonvolatile memory device and a method of fabricating the same.

2. Description of the Related Art

A nonvolatile memory device, e.g., a read-only memory (ROM), an erasable and programmable read-only memory (EPROM), an electrically erasable and programmable read-only memory (EEPROM), and so forth, may retain stored data even without power supply. For example, the EEPROM, e.g., a flash memory, may electrically change stored data rapidly and easily, and may have a very high integration level, e.g., the flash memory may high integration level because of its small unit cell area. Accordingly, a market for, e.g., a flash memory device, has increased in recent years.

A conventional nonvolatile memory device may include a charge storage layer disposed between a control gate and a semiconductor substrate. A tunnel insulating layer may be disposed between the charge storage layer and the semiconductor substrate, and a dielectric layer may be disposed between the charge storage layer and the control gate. The nonvolatile memory device may store charges to represent data, e.g., logical "1" or logical "0," depending on whether a charge is injected into the charge storage layer. The conventional nonvolatile memory device may be classified into a floating gate memory device and a charge trap memory device according to the type of its charge storage layer.

For example, a charge storage layer of the conventional floating gate flash memory device may include a floating gate, so the floating gate and the control gate may be sequentially stacked. A storage layer of the conventional charge trap flash memory device may have a MOSFET-like structure, i.e., may include a thin layer with a plurality of trap sites, and may be referred to as a charge trap layer. For example, the conventional charge trap flash memory device, e.g., SONOS or MONOS charge trap flash memory device, may include a silicon nitride layer as a charge trap layer.

An erase operation of the conventional memory device may be performed by applying an erase voltage, e.g., about (−15) V to about (−20) V, to the control gate. When the erase voltage is applied to the control gate in the conventional memory device, however, back tunneling may occur. For example, when erase voltage is applied to the control gate in the conventional memory device, electrons may move from the control gate toward the charge storage layer, and may remain in the dielectric layer between the control gate and the charge storage layer. Also, the back tunneling may occur even when the erase voltage is not applied to the control gate. Consequently, the time required to perform an erase operation of the conventional memory device may be increased. Further, data retention characteristics of the charge storage layer may be reduced, thereby decreasing reliability and operability of the memory device.

SUMMARY OF THE INVENTION

Example embodiments are therefore directed to a nonvolatile memory device and a method of fabricating the same, which substantially overcome one or more of the shortcomings and disadvantages of the related art.

It is therefore a feature of an example embodiment to provide a nonvolatile memory device having minimized loss of charges stored in the charge storage layer.

It is another feature of an example embodiment to provide a method of processing a dielectric layer between a charge storage layer and a control gate in order to minimize the loss of charges stored in the charge storage layer.

At least one of the above and other features may be realized by providing a method of fabricating a nonvolatile memory device, including forming a tunnel insulating layer on a semiconductor substrate, forming a charge storage layer on the tunnel insulating layer, forming a dielectric layer including a first aluminum oxide layer, a silicon oxide layer, and a second aluminum oxide layer that are sequentially stacked on the charge storage layer, and forming a gate electrode on the dielectric layer. The first aluminum oxide layer and/or the second aluminum oxide layer may be thermally treated for crystallization before formation of another thin layer.

In some embodiments, the method may further include performing a first thermal treatment on the first aluminum oxide layer at a first thermal treatment temperature to crystallize the first aluminum oxide layer before the forming of the silicon oxide layer, and performing a second thermal treatment on the second aluminum oxide layer at a second thermal treatment temperature different from the first thermal treatment temperature to crystallize the second aluminum oxide layer before the forming of the gate electrode. The second thermal treatment may apply a smaller thermal load to the aluminum oxide layer than the first thermal treatment. The first thermal treatment temperature may be lower than the second thermal treatment temperature. The first thermal treatment temperature may be about 850° C. to about 1350° C., and the second thermal treatment temperature may be about 600° C. to about 1300° C. The first thermal treatment temperature may be about 1000° C. to about 1300° C., and the second thermal treatment temperature may be about 850° C. to about 1100° C.

In other embodiments, the method may further include performing a thermal oxidation process on the silicon oxide layer before the forming of the second aluminum oxide layer. The thermal oxidation process may be performed using at least one of a Rapid Thermal Oxidation (RTO) process, an ultraviolet treatment, and an ozone treatment. The charge storage layer may be formed of a nonconductive layer configured to store charges. The charge storage layer may be formed to include a charge trap layer, and a portion of the gate electrode contacting the second aluminum oxide layer may include a conductive layer with a work function greater than about 4.0 eV.

At least one of the above and other features may be realized by providing a method of fabricating a nonvolatile memory device, including forming a charge storage layer on a tunnel insulating layer on a semiconductor substrate, sequentially forming a first aluminum oxide layer contacting the charge storage layer, a silicon oxide layer, and a second aluminum oxide layer, and forming a gate electrode contacting the second aluminum oxide layer on the second aluminum oxide layer, wherein the first aluminum oxide layer and the second aluminum oxide layer are thermally treated to minimize the back tunneling from the gate electrode.

At least one of the above and other features may be realized by providing a nonvolatile memory device, including a tunnel insulating layer on a semiconductor substrate, a charge storage layer on the tunnel insulating layer, a dielectric layer including a first aluminum oxide layer, a silicon oxide layer, and a second aluminum oxide layer that are sequentially stacked on the charge storage layer, and a gate electrode on the dielectric layer. The first aluminum oxide layer and/or the second aluminum oxide layer may include crystalline aluminum.

In some embodiments, the first aluminum oxide layer may have a crystalline portion to prevent the silicon atoms of the silicon oxide layer from diffusing to an interface between the charge storage layer and the first aluminum oxide layer. The first aluminum oxide layer may have a crystalline phase that is crystallized at a higher temperature than a crystalline phase of the second aluminum oxide layer. The first aluminum oxide layer and the second aluminum oxide layer may be different in crystalline phase from each other. The first aluminum oxide layer may have a crystalline phase crystallized at about 850° C. or more. A SiO-peak intensity measured by Secondary Ion Mass Spectroscopy (SIMS) may be greater in the silicon oxide layer than in an interface between the charge storage layer and the first aluminum oxide layer. The charge storage layer may include a charge trap layer, and a portion of the gate electrode contacting the second aluminum oxide layer may include a conductive layer with a work function greater than about 4.0 eV. The charge storage layer may include polysilicon.

BRIEF DESCRIPTION OF THE DRAWINGS

The above and other features and advantages will become more apparent to those of ordinary skill in the art by describing in detail exemplary embodiments with reference to the attached drawings, in which.

DETAILED DESCRIPTION OF THE INVENTION

Figure 1:
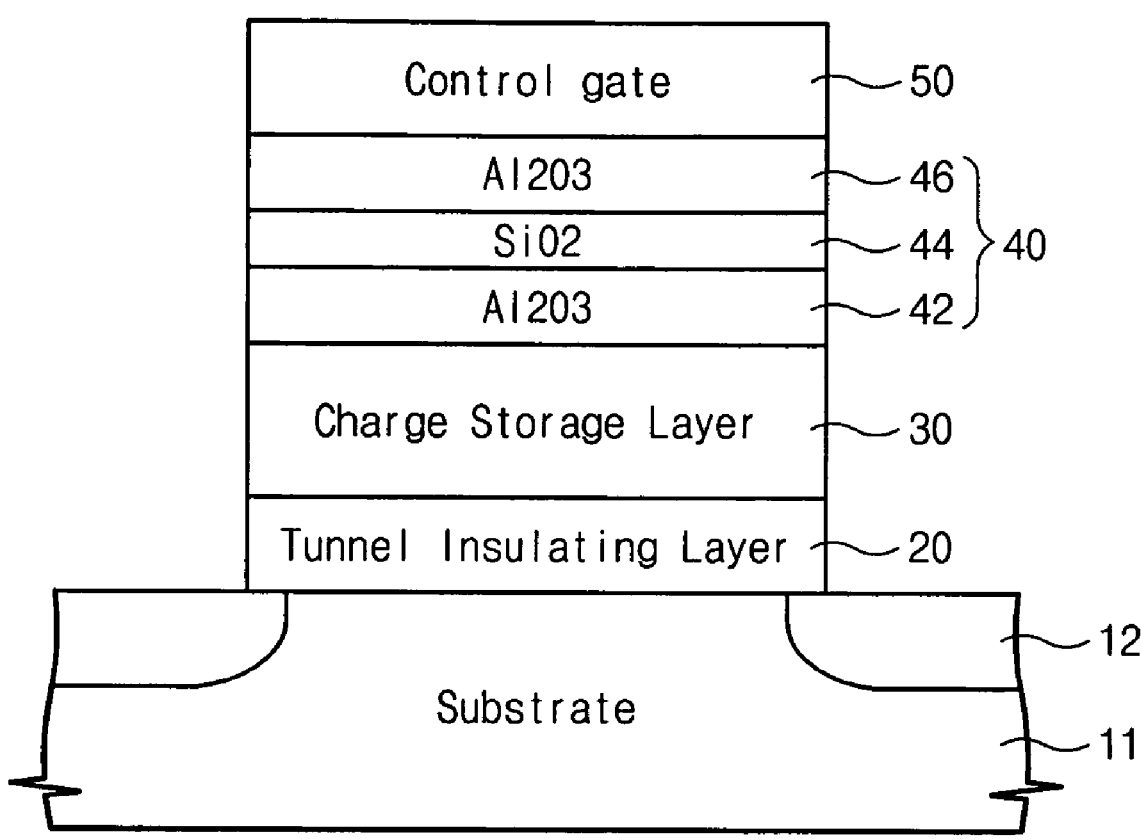
FIG. 1 illustrates a cross-sectional view of a nonvolatile memory device according to example embodiments.

Korean Patent Application No. 10-2008-0026489, filed on Mar. 21, 2008, in the Korean Intellectual Property Office, and entitled: "Nonvolatile Memory Device and Method of Fabricating the Same," is incorporated by reference herein in its entirety.

Example embodiments will now be described more fully hereinafter with reference to the accompanying drawings; however, they may be embodied in different forms and should not be construed as limited to the embodiments set forth herein. Rather, these embodiments are provided so that this disclosure will be thorough and complete, and will fully convey the scope of the invention to those skilled in the art.

In the drawing figures, the dimensions of layers and regions may be exaggerated for clarity of illustration. It will also be understood that when a layer or element is referred to as being "on" another layer or substrate, it can be directly on the other layer or substrate, or intervening layers may also be present. Further, it will be understood that when a layer is referred to as being "under" another layer, it can be directly under, and one or more intervening layers may also be present. In addition, it will also be understood that when a layer is referred to as being "between" two layers, it can be the only layer between the two layers, or one or more intervening layers may also be present. Like reference numerals refer to like elements throughout.

As used herein, the expressions "at least one," "one or more," and "and/or" are open-ended expressions that are both conjunctive and disjunctive in operation. For example, each of the expressions "at least one of A, B, and C," "at least one of A, B, or C," "one or more of A, B, and C," "one or more of A, B, or C" and "A, B, and/or C" includes the following meanings: A alone; B alone; C alone; both A and B together; both A and C together; both B and C together; and all three of A, B, and C together. Further, these expressions are open-ended, unless expressly designated to the contrary by their combination with the term "consisting of." For example, the expression "at least one of A, B, and C" may also include an nth member, where n is greater than 3, whereas the expression "at least one selected from the group consisting of A, B, and C" does not.

As used herein, the terms "a" and "an" are open terms that may be used in conjunction with singular items or with plural items.

Also, though terms like "first," "second," and "third" are used to describe various regions and layers in various embodiments of the present invention, the regions and the layers are not limited to these terms. These terms are used only to tell one region or layer from another region or layer. An embodiment described and exemplified herein includes a complementary embodiment thereof.

FIG. 1 illustrates a cross-sectional view of a nonvolatile memory device 10 according to example embodiments. Referring to FIG. 1, the nonvolatile memory device 10 may include a semiconductor substrate 11, a tunnel insulating layer 20 on the semiconductor substrate 11, a charge storage layer 30 on the tunnel insulating layer 20, a dielectric layer 40 on the charge storage layer 30, and a control gate 50 on the dielectric layer 40. It is noted that the terms "gate electrode" and "control gate" are used interchangeably throughout the specification.

The semiconductor substrate 11 may include, e.g., one or more of a monocrystalline silicon layer, a silicon-on-insulator (SOI) layer, a silicon layer on a silicon germanium (SiGe) layer, a monocrystalline silicon layer on an insulating layer, a polysilicon layer on an insulating layer, and so forth. The semiconductor substrate 11 may include an impurity region 12, e.g., the impurity region 12 may be opposite in conductivity type to the semiconductor substrate 11. The tunnel insulating layer 20 may be on the semiconductor substrate 11, e.g., directly on the semiconductor substrate 11, and may include, e.g., one or more of a silicon oxide layer, a silicon oxynitride (SiON) layer, a high-dielectric layer, and so forth.

The charge storage layer 30 may be a charge trap layer or a floating gate. The charge storage layer 30 may include an insulating material. For example, if the charge storage layer 30 is a charge trap layer, the charge trap layer may include a nonconductive insulating layer with charge-trapping sites. In another example, if the charge storage layer 30 is a charge trap layer, the charge trap layer may include an insulating layer with a nanodot and a silicon nitride layer. The nanodot may include one or more of nanocrystalline silicon, nanocrystalline silicon germanium, nanocrystalline metal, and so forth. In yet another example, if the charge storage layer 30 is a floating gate, the floating gate may include polysilicon.

The dielectric layer 40 may be on the charge storage layer 30, e.g., directly on the charge storage layer 30. For example, if the charge storage layer 30 is a charge trap layer, the dielectric layer 40 may be a blocking insulating layer. In another example, if the charge storage layer 30 is a floating gate, the dielectric layer 40 may be an inter-gate insulating layer. The dielectric layer 40 may include a first aluminum oxide layer 42, a silicon oxide layer 44, and a second aluminum oxide layer 46. For example, the first aluminum oxide layer 42, silicon oxide layer 44, and second aluminum oxide layer 46 may be sequentially stacked on the charge storage layer 30, so the first aluminum oxide layer 42 may be, e.g., directly, between the charge storage layer 30 and the silicon oxide layer 44. At least one of the first aluminum oxide layer 42 and the second aluminum oxide layer 46 may be crystallized.

For example, at least a portion of the first aluminum oxide layer 42 may be crystallized, so diffusion of silicon from the silicon oxide layer 44 to an interface between the charge storage layer 30 and the first aluminum oxide layer 42 may be prevented or substantially minimized. As such, the crystallized portion of the first aluminum oxide layer 42 may improve interface characteristics between the charge storage layer 30 and the first aluminum oxide layer 42. Further, crystallization of the first aluminum oxide layer 42 and/or the second aluminum oxide layer 46 may minimize the back tunneling from the control gate 50 to the charge storage layer 30 through the dielectric layer 40. Examples of the crystalline phase of the first and second aluminum oxide layers 42 and 46 may include a gamma phase ($\gamma$-$Al_2O_3$), a kappa phase ($\kappa$-$Al_2O_3$), and an alpha phase ($\alpha$-$Al_2O_3$). For example, the first aluminum oxide layer 42 and the second aluminum oxide layer 46 may have different crystalline phases, e.g., the crystalline phase of the first aluminum oxide layer 42 may be crystallized at a higher temperature than the crystalline phase of the second aluminum oxide layer 46.

The control gate 50 may be on the dielectric layer 40, e.g., in direct contact with the second aluminum oxide layer 46 of the dielectric layer 40, and may include a conductive material with a work function greater than about 4.0 eV. For example, the conductive material in the control gate 50 may include at least one of TaN, W, WN, and TiN. The control gate 50 may further include other conductive materials, e.g., polysilicon.

Figure 2:
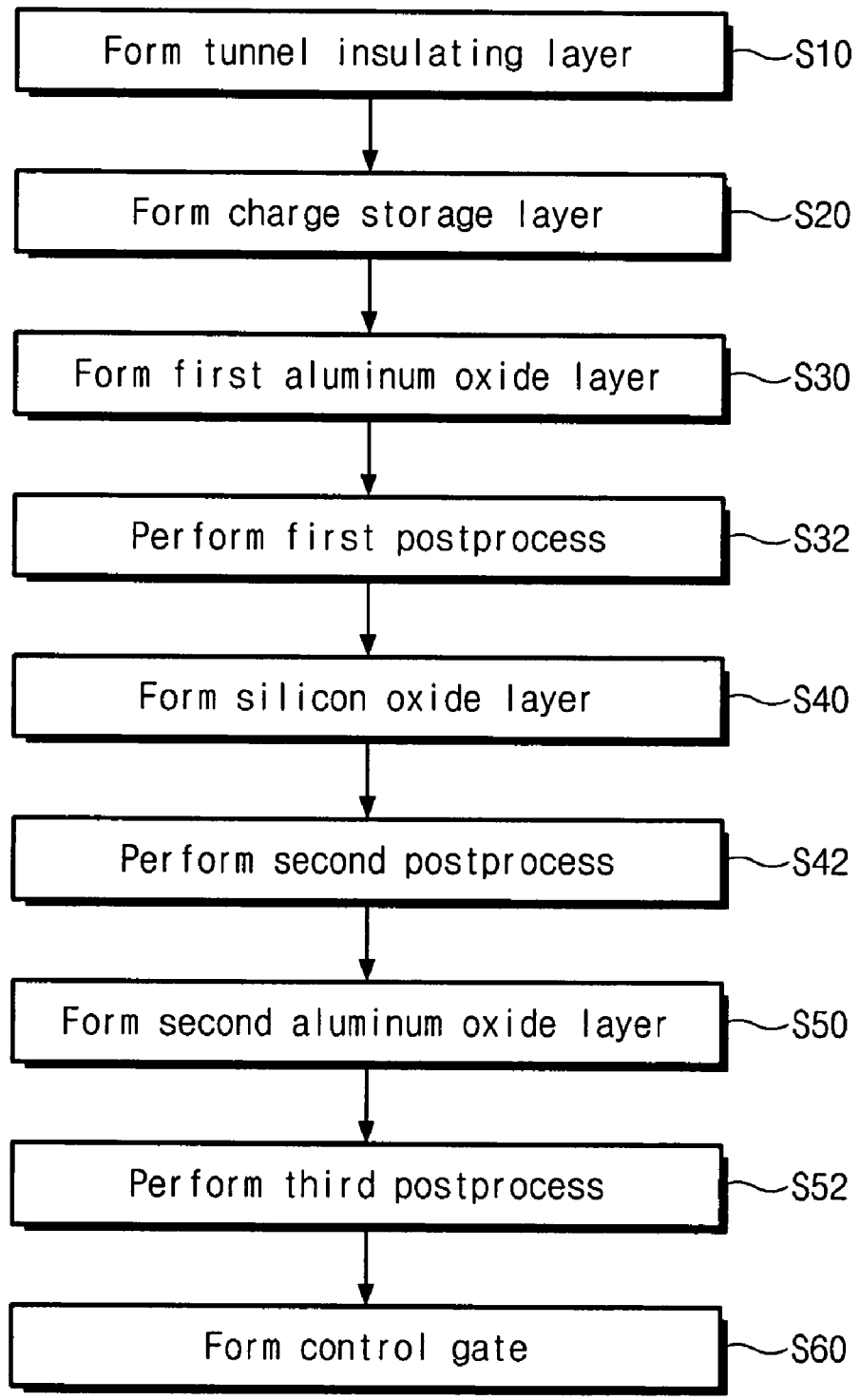
FIG. 2 illustrates a flow diagram of a method of fabricating a nonvolatile memory device according to example embodiments.

FIG. 2 illustrates a flow diagram of a method of fabricating a nonvolatile memory device according to example embodiments.

Referring to FIGS. 1 and 2, the tunnel insulating layer 20 may be formed on the semiconductor substrate 11, e.g., directly on the semiconductor substrate 11, in operation S10. The tunnel insulating layer 20 may include at least one of a silicon oxide layer, a silicon oxynitride (SiON) layer, and a high-dielectric layer. The tunnel insulating layer 20 may be formed, e.g., by thermal oxidation of the semiconductor substrate 11. For example, the semiconductor substrate 11 may be thermally oxidized to form a silicon oxide layer thereon.

In operation S20, the charge storage layer 30 may be formed on the tunnel insulating layer 20, e.g., directly on the tunnel insulating layer 20. The charge storage layer 30 may be a charge trap layer or a floating gate. The charge trap layer may be a nonconductive insulating layer including charge-trapping sites. The charge trap layer may be formed of an insulating layer including, e.g., a nanodot and/or a silicon nitride layer. The nanodot may include, e.g., nanocrystalline silicon, nanocrystalline silicon germanium, and/or nanocrystalline metal. The floating gate may be formed, e.g., of polysilicon.

In operation S30, the first aluminum oxide layer 42 may be formed on the charge storage layer 30. In detail, a preliminary first aluminum oxide layer may be formed on the charge storage layer 30, e.g., directly on the charge storage layer 30. The preliminary first aluminum oxide layer may be formed using, e.g., Atomic Layer Deposition (ALD) process. The preliminary first aluminum oxide layer may have an amorphous phase.

In operation S32, a first postprocess may be performed on the preliminary first aluminum oxide layer, so at least a portion of the preliminary first aluminum oxide layer may be crystallized to form the first aluminum oxide layer 42. Accordingly, the first aluminum oxide layer 42 may be partially or completely crystallized. The first postprocess may be performed using, e.g., a thermal treatment process. For example, the thermal treatment process may be performed at a thermal treatment temperature of about 850° C. to about 1350° C., e.g., at about 1000° C. to about 1300° C. The crystalline phase of the first aluminum oxide layer 42 may vary according to the thermal treatment temperature used in the thermal treatment process. For example, the preliminary first aluminum oxide layer may be thermally treated at about 850° C., so the preliminary first aluminum oxide layer may be crystallized at about 850° C. to form a first aluminum oxide layer 42 having a crystalline structure of a gamma phase ($\gamma$-$Al_2O_3$). Further crystallization, e.g., thermal treatment, of the first aluminum oxide layer 42 having the crystalline structure of the gamma phase ($\gamma$-$Al_2O_3$) may produce a first aluminum oxide layer 42 having a partial or complete crystalline structure of a kappa phase ($\kappa$-$Al_2O_3$) and/or an alpha phase ($\alpha$-$Al_2O_3$).

Accordingly, diffusion of silicon atoms from the silicon oxide layer 44 formed subsequently on the first aluminum oxide layer 42, as will be discussed in more detail below, into the first aluminum oxide layer 42 may be prevented or substantially minimized because of the crystallized structure of the first aluminum oxide layer 42. Thus, formation of a silicon oxide layer at an interface between the first aluminum oxide layer 42 and the charge storage layer 30 may be prevented or substantially minimized, so interface characteristics between the first aluminum oxide layer 42 and the charge storage layer 30 may be substantially improved. The improved interface characteristics between the first aluminum oxide layer 42 and the charge storage layer 30 may improve charge storage characteristics of the charge storage layer 30, e.g., minimized charge loss, so stability of the charge storage characteristics may be increased. The charge storage characteristics of the charge storage layer 30 with respect to thermal treatment temperatures, i.e., thermal treatment in the first postprocess, will be discussed in more detail below with reference to FIG. 3.

Figure 3:
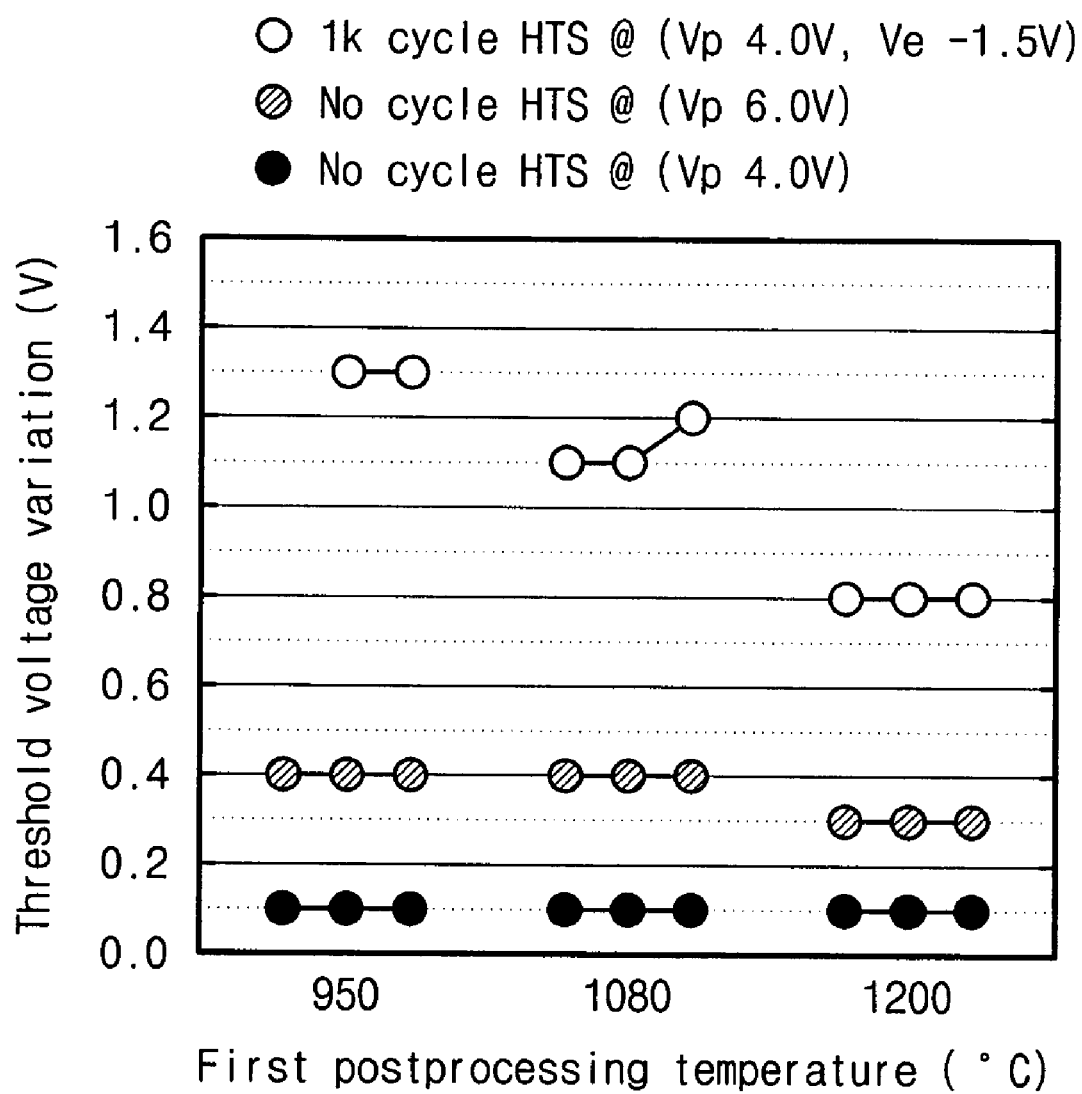
FIGS. 3-7 illustrate graphs of charge storage characteristics with respect to thermal treatment temperatures during manufacturing stages of nonvolatile memory devices.

FIG. 3 illustrates a graph of charge storage characteristics of the charge storage layer 30 with respect to thermal treatment temperature of the first postprocess, i.e., variation of a threshold voltage with respect to a high-temperature stress. It is noted that in the tests performed and illustrated in FIG. 3, nonvolatile memory devices according to example embodiment were used, i.e., nonvolatile memory device having a structure of FIG. 1. The first aluminum oxide layer 42 in each of the nonvolatile memory devices tested was formed via a first postprocess as described above at a thermal treatment temperature ranging from about 950° C. to about 1200° C., and the second aluminum oxide layer 46 formed subsequently on the first aluminum oxide layer 42 via a third postprocess, i.e., as will be described in more detail below with reference to FIGS. 2 and 6, was formed at a thermal treatment temperature of 1080° C. It is further noted that the first postprocess was performed on a plurality of wafer samples, and in the graph of FIG. 3, each of three data points corresponds to each of wafer samples The charge storage characteristics of the charge storage layer 30 in each memory device, i.e., transistor, was tested via a High Temperature Storage (HTS) test. First, a cycle HTS test was performed by repeating a program/erase operation 1000 times by each transistor, followed by a heating process at 200° C. for 2 hours of the transistor. A threshold voltage Vth difference in the transistor in a program state before and after the heating process was measured. In the cycle HTS test, a program voltage Vp was 4 V and an erase voltage Ve was (−1.5 V). Next, a no-cycle HTS test was done by performing a one-time charge storage operation, followed by a heating process at 200° C. for 2 hours. A threshold voltage Vth difference in the transistor in a program state before and after the heating process was measured. In a first no-cycle HTS test, the program voltage Vp was 4 V, and in a second no-cycle HTS test, the program voltage was 6 V.

As illustrated in FIG. 3, when the preliminary first aluminum oxide layer is thermally treated according to example embodiments, i.e., via the first postprocess, the threshold voltage Vth variation was reduced as the thermal treatment temperature increased. In other words, as illustrated in FIG. 3, as the thermal treatment temperature increased, i.e., crystallization of the first aluminum oxide layer increased, the threshold voltage Vth variation in the cycle HTS and the second no-cycle HTS decreased. Accordingly, the first postprocess according to example embodiments may provide improved charge storage characteristics as the thermal treatment temperature increases. It is further noted, in view of FIG. 3, that a threshold voltage Vth variation due to a high-temperature stress was the smallest when the thermal treatment temperature was about 1200° C., i.e., when considering a thermal load of a semiconductor process, thereby providing the most stable charge storage characteristics.

Referring back to FIGS. 1 and 2, the silicon oxide layer 44 may be formed on the first aluminum oxide layer 42 in operation S40. In detail, a preliminary silicon oxide layer may be formed on the first aluminum oxide layer 42, e.g., directly on the first aluminum oxide layer 42. The preliminary silicon oxide layer 44 may be formed using, e.g., the ALD process.

In operation S42, a second postprocess may be performed to densify the preliminary silicon oxide layer to form the silicon oxide layer 44, thereby increasing the reliability of the silicon oxide layer 44. The second postprocess may be performed using, e.g., a Rapid Thermal Oxidation (RTO) process, an ultraviolet (UV) treatment, and/or an ozone ($O_3$) treatment. For example, the RTO process may be performed on the preliminary silicon oxide layer for about two minutes at a temperature of about 750° C. to form the silicon oxide layer 44 with a densified structure.

Figure 4:
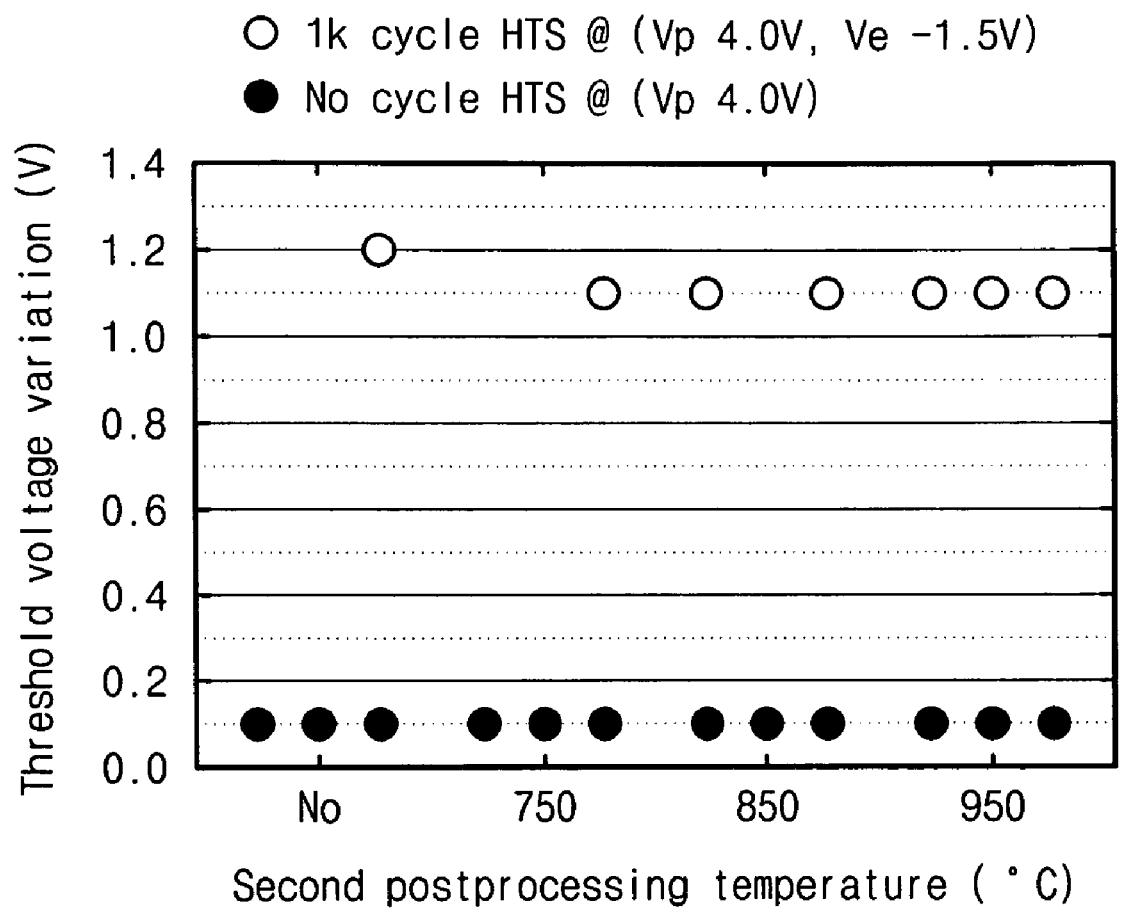
Figure 5:
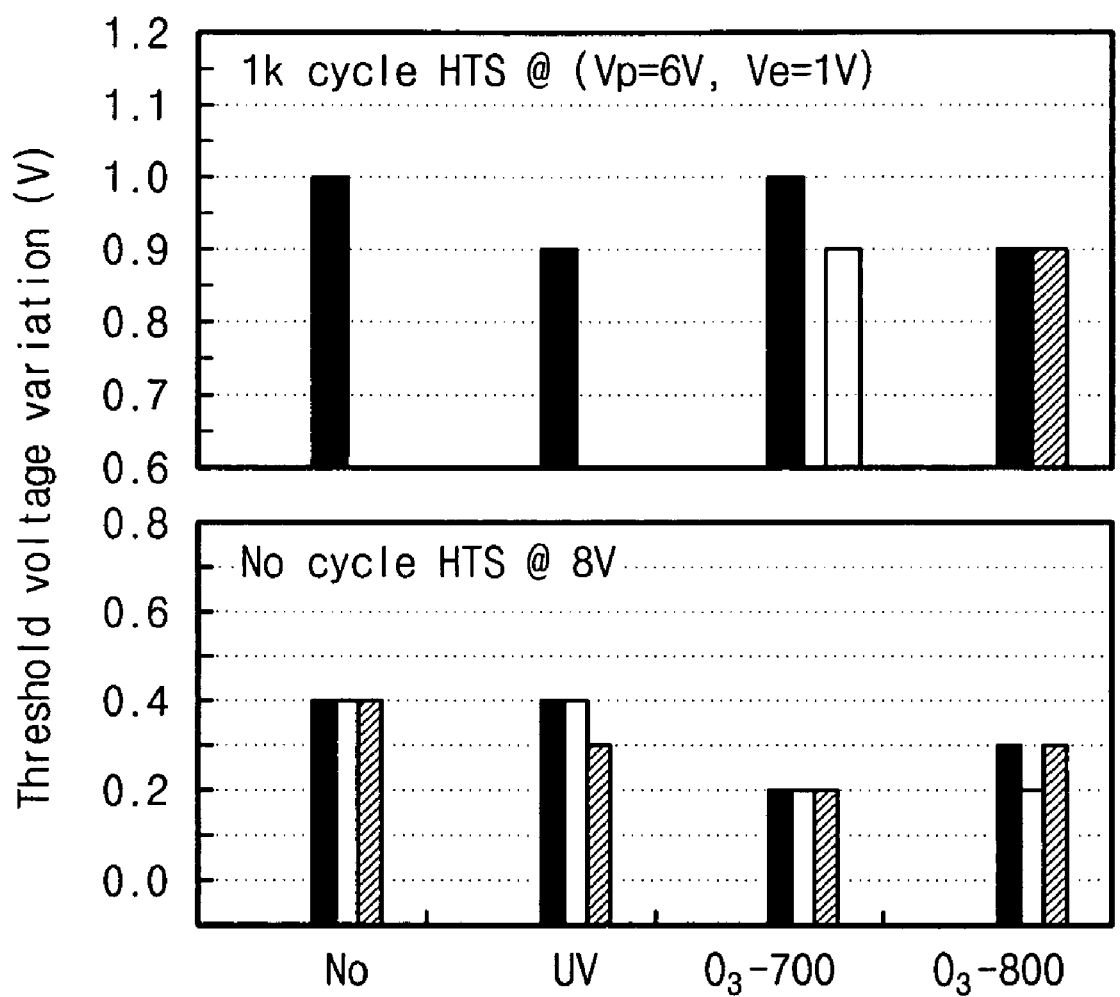

With respect to FIGS. 4 and 5, the second postprocess (corresponding to performing a thermal oxidation process on the silicon oxide layer before forming the second aluminum oxide layer) is performed on a plurality of wafer samples using a UV treatment and ozone treatment. As illustrated in FIG. 4, an RTO process at a temperature of about 750° C. or higher may provide improved charge storage characteristics in the charge storage layer 30. In other words, as illustrated in FIG. 4, when the preliminary silicon oxide layer was densified via an RTO process for about 2 minutes at a temperature of about 750° C. or higher, the cycle HTS characteristics exhibited an improvement of about 0.1 V, as compared to cycle HTS characteristics when the second postprocess temperature is lower than 750° C.

As illustrated in FIG. 5, a UV treatment and an ozone treatment may improve the cycle HTS characteristics and the no-cycle HTS characteristics. In the graph of FIG. 5, each of different bars corresponds to each of wafer samples. For example, a solid bar represents a variation of Vth of a wafer sample 1, a hollow bar indicates a variation of Vth of a wafer sample 2, and a hatched bar shows a variation of Vth of a wafer sample 3. It is noted that the ozone treatment of FIG. 5 was performed for about 10 minutes at about 700° C. and at about 800° C. Further, the cycle HTS test was performed at voltage Vp=6 V and voltage Ve=1 V, and the no-cycle HTS test was performed at voltage Vp=8 V. It is noted that the HTS tests performed and illustrated in FIGS. 4 and 5 were performed as described previously with reference to FIG. 3 unless otherwise noted.

Referring back to FIGS. 1 and 2, the second aluminum oxide layer 46 may be formed on the silicon oxide layer 44 in operation S50. In detail, a preliminary second aluminum oxide layer may be formed on the silicon oxide layer 44, e.g., directly on the silicon oxide layer 44. The preliminary second aluminum oxide layer 46 may be formed using, e.g., the ALD process. The deposited preliminary second aluminum oxide layer may have an amorphous phase.

In operation S52, a third postprocess may be performed to crystallize the amorphous-phase preliminary second aluminum oxide layer to form the second aluminum oxide layer 46 having a crystalline phase. The third postprocess may be performed using, e.g., the thermal treatment process. The third postprocess may apply a smaller thermal load to the second aluminum oxide layer 46 than the thermal load of the first postprocess applied to the first aluminum oxide layer 42. That is, the third postprocess may be performed at a lower thermal treatment temperature than the first postprocess. For example, the thermal treatment temperature of the third postprocess may be about 600° C. to about 1300° C., e.g., about 850° C. to about 1100° C. The third post process may crystallize, e.g., partially or completely, the preliminary second aluminum oxide layer, and may further densify the silicon oxide layer 44. Since the third postprocess is performed at a lower thermal treatment temperature than the first postprocess, the first aluminum oxide layer 42 and the second aluminum oxide layer 46 may be crystallized at different temperature and, therefore, may have different crystalline phases. The first aluminum oxide layer 42 may have the crystalline phase that is crystallized at a higher temperature than the crystalline phase of the second aluminum oxide layer 46.

The crystallization of the first and second aluminum oxide layers 42 and 46 may be performed before formation of other layers, e.g., thin layers, thereon. In other words, once an aluminum oxide layer is covered by another layer, crystallization of the aluminum oxide layer through the layer thereon may be difficult, e.g., even at a high-temperature thermal treatment. For example, even a temperature of about 850° C., i.e., a temperature for activation of an impurity region, may be insufficient for easily crystallizing an aluminum oxide layer through a layer thereon. Accordingly, the first postprocess, i.e., crystallization of the first aluminum oxide layer 42, may be completely finished before formation of the silicon oxide layer 44 thereon. Further, the third process, i.e., crystallization of the second aluminum oxide 46, may be completely finished before formation of the control gate 50 thereon.

Figure 6:
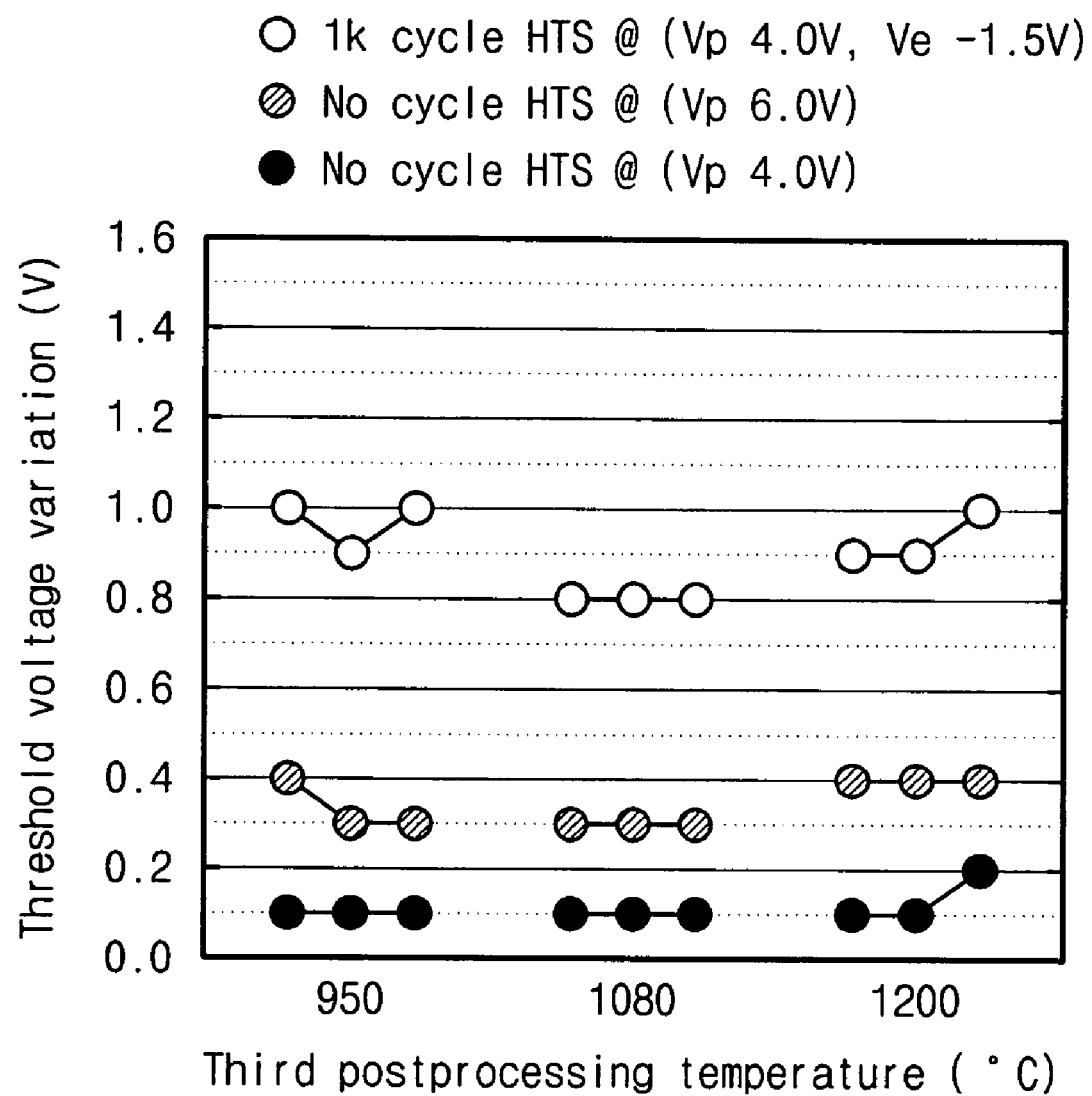

FIG. 6 illustrates a graph of charge storage characteristics of the charge storage layer 30 with respect to a change in the thermal treatment temperature of the third postprocess. It is noted that that memory devices tested included first aluminum oxide layer 42 formed at a thermal treatment temperature of 1200° C. in the first postprocess, while the thermal treatment temperature of the third postprocess was varied between about 950° C. to about 1200° C. It is noted that the HTS tests performed and illustrated in FIG. 6 were performed as described previously with reference to FIG. 3 unless otherwise noted.

As illustrated in FIG. 6, when the thermal treatment temperature of the third postprocess was about 1080° C., a threshold voltage change due to repetition of a high-temperature program/erase operation was the smallest, thereby providing an improved stability of the charge storage characteristics of the charge storage layer 30. If the thermal treatment temperature of the third postprocess is too high, while crystallinity of the second aluminum oxide layer 46 may improve, interface characteristics between the second aluminum oxide layer 46 and silicon oxide layer 44 may degrade due to the interdiffusion therebetween. If the thermal treatment temperature of the third postprocess is too low, the second aluminum oxide layer 46 may not be crystallized to a sufficient level, thereby degrading charge storage characteristics, e.g., exhibit increased threshold variation.

Figure 7:
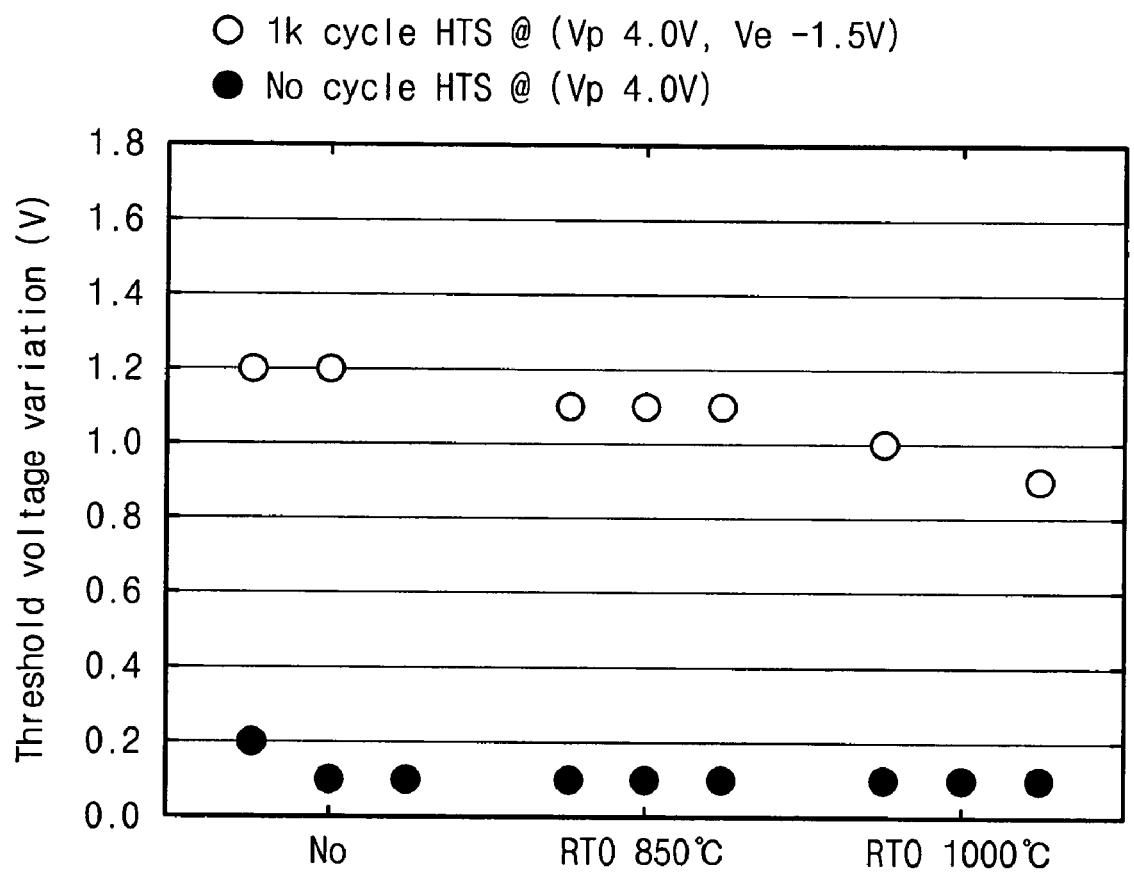

The thermal treatment of the third postprocess may be, e.g., an RTO process. For example, as illustrated in FIG. 7, the third post process may be performed via RTO for about 2 minutes. It is noted that the memory devices tested and illustrated in FIG. 7 had a first aluminum oxide layer 42 formed in the first postprocess at a thermal treatment temperature of about 1200° C. As further illustrated in FIG. 7, an RTO process at a temperature of about 850° C. or higher may improve the charge storage characteristics of the charge storage layer 30.

Referring back to FIGS. 1 and 2, the control gate 50 may be formed on the second aluminum oxide layer 46 in operation S60. The control gate 50 may contact the second aluminum oxide layer 46, and may include a conductive material with a work function greater than about 4.0 eV. For example, the conductive material may include at least one of TaN, W, WN, and TiN. The control gate 50 may further include other conductive materials, e.g., polysilicon. The control gate 50, the dielectric layer 40, the charge storage layer 30, and the tunnel insulating layer 20 may be patterned, and impurity regions 12 may be formed in the semiconductor substrate 11 adjacent to the patterned structure. The impurity regions 12 may have impurity ions that are opposite in conductivity type to the semiconductor substrate 11.

Figure 8:
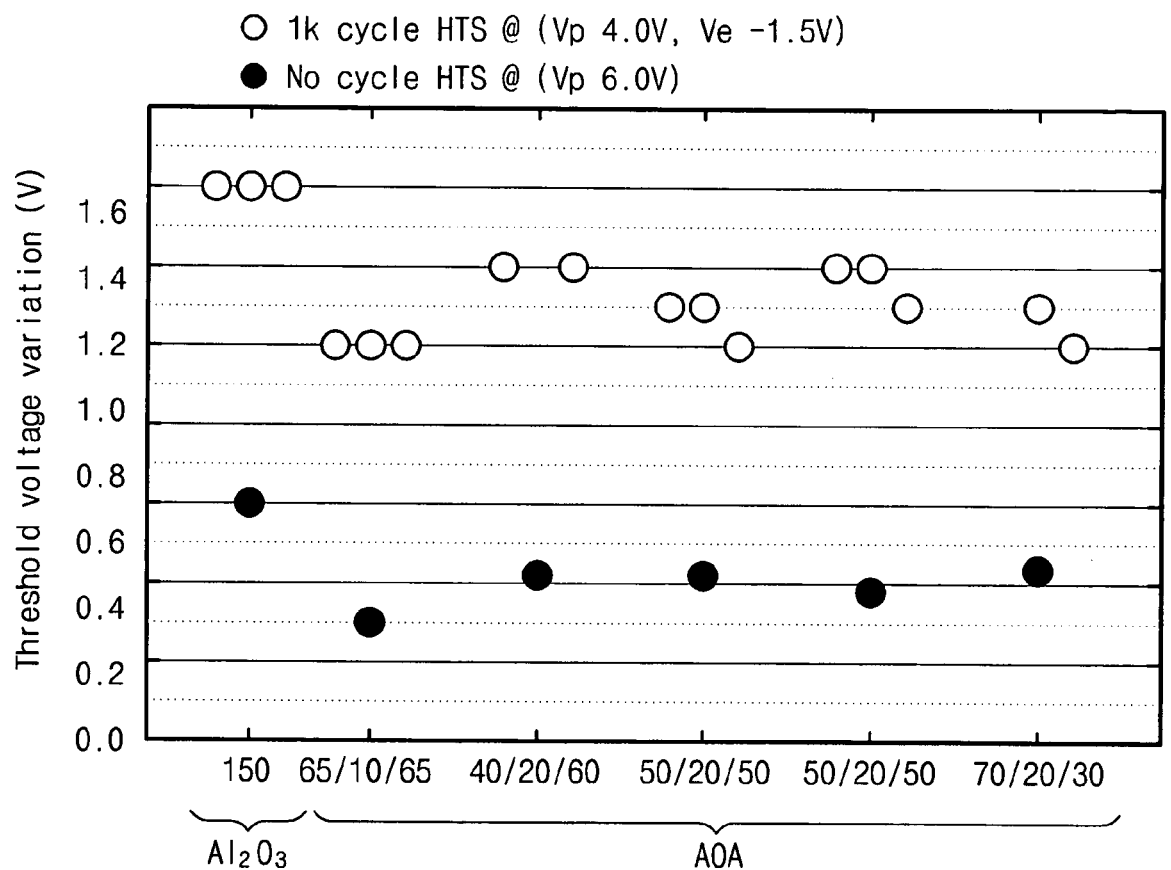
FIGS. 8 and 9 illustrate graphs of charge storage characteristics with respect to layer thickness in nonvolatile memory devices.

FIG. 8 illustrates a graph of the charge storage characteristics of the charge storage layer 30 with respect to thickness changes in the first aluminum oxide layer 42, the silicon oxide layer 44 and the second aluminum oxide layer 46 of the dielectric layer 40. In the memory devices tested and illustrated in the graph of FIG. 8, the first to third postprocesses were performed under the same conditions as described previously. As illustrated in FIG. 8, use of a stack of an aluminum oxide layer/a silicon oxide layer/an aluminum oxide layer (AOA) provided better charge storage characteristics than the use of a single aluminum oxide layer ($Al_2O_3$). For example, an AOA layer having respective thicknesses of 65/10/65 exhibited better charge storage characteristics than a single aluminum oxide layer having a thickness of 150 angstroms, as illustrated in FIG. 8. In the graph of FIG. 8, the numerals of the horizontal axis denote the thicknesses (A) of the stacked layers.

Figure 9:
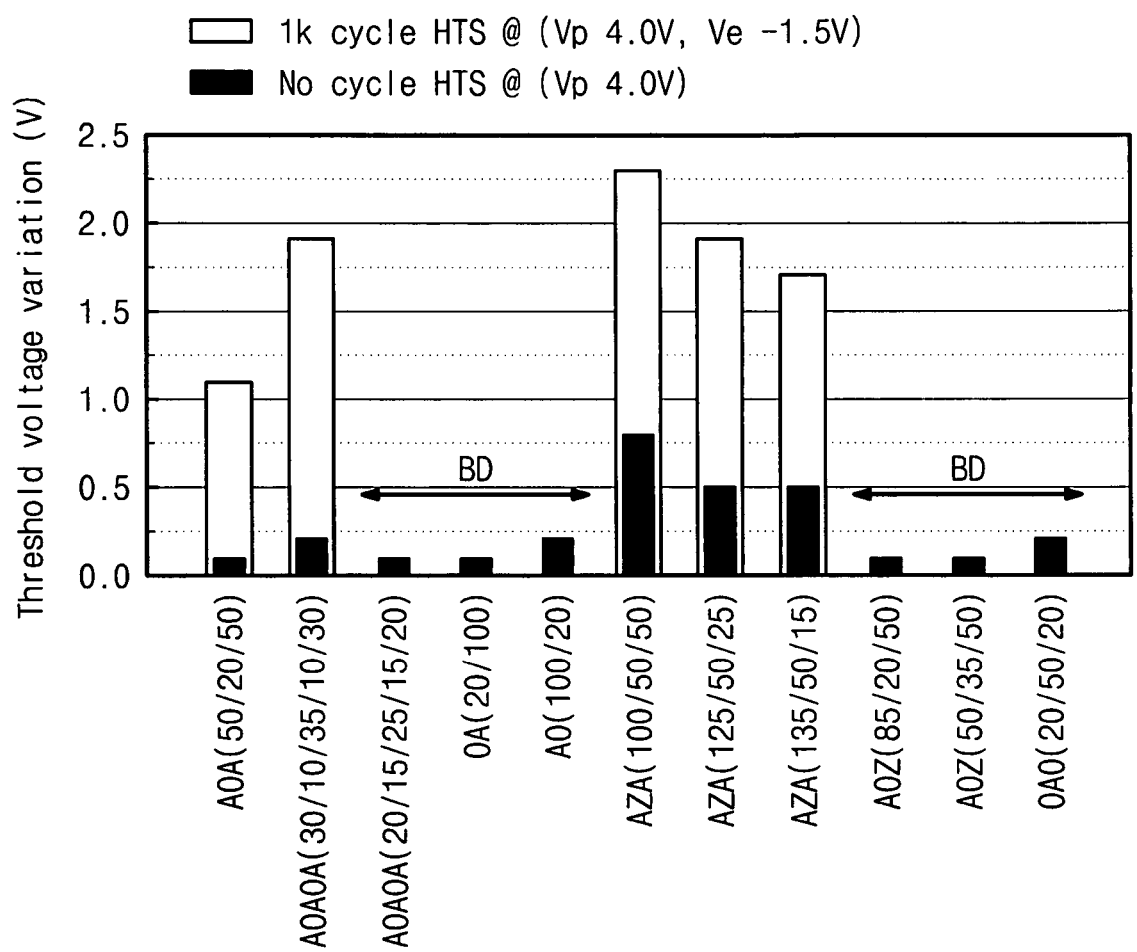

FIG. 9 illustrates a graph of charge storage characteristics of the charge storage layer 30 with respect to different combinations of metal oxide layers and silicon oxide layers in the dielectric layer 40. In FIG. 9, a symbol A denotes an aluminum oxide layer, a symbol O denotes a silicon oxide layer, and a symbol Z denotes a zirconium oxide layer. The numerals in parentheses denote the thicknesses (Å) of the stacked layers. The first through third postprocesses were performed under the same conditions as described previously. As illustrated in FIG. 9, use of a stack of AOA exhibited better charge storage characteristics than use any of the other layer combinations and configurations in FIG. 9. Moreover, as further illustrated in FIG. 9, in some of the stacked layers a threshold voltage was substantially increased, and a breakdown (BD) occurred.

Figure 10:
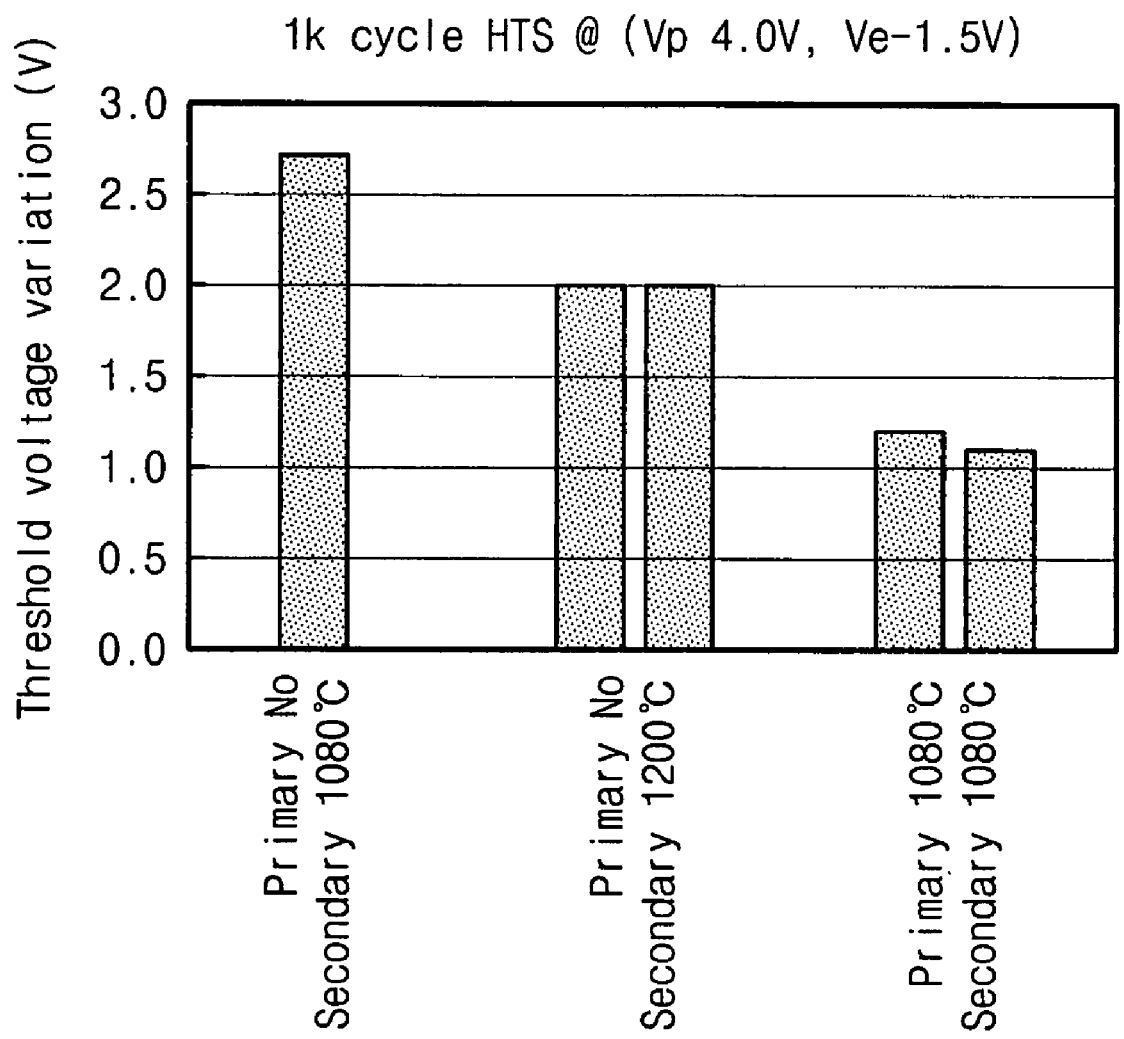
FIG. 10 illustrates a graph of charge storage characteristics with respect to postprocesses during manufacturing of nonvolatile memory device.

FIG. 10 illustrates a graph of charge storage characteristics of the charge storage layer 30 with respect to performance/non-performance of the first postprocess and the third postprocess when the dielectric layer 40 includes a stack of AOA. As illustrated in FIG. 10, performance of both the first and third postprocesses, i.e., formation of both the first and second aluminum oxide layers with crystallized structures via the first and third postprocess, provided better results than use of a single postprocess, i.e., only the third postprocess.

Figure 11:
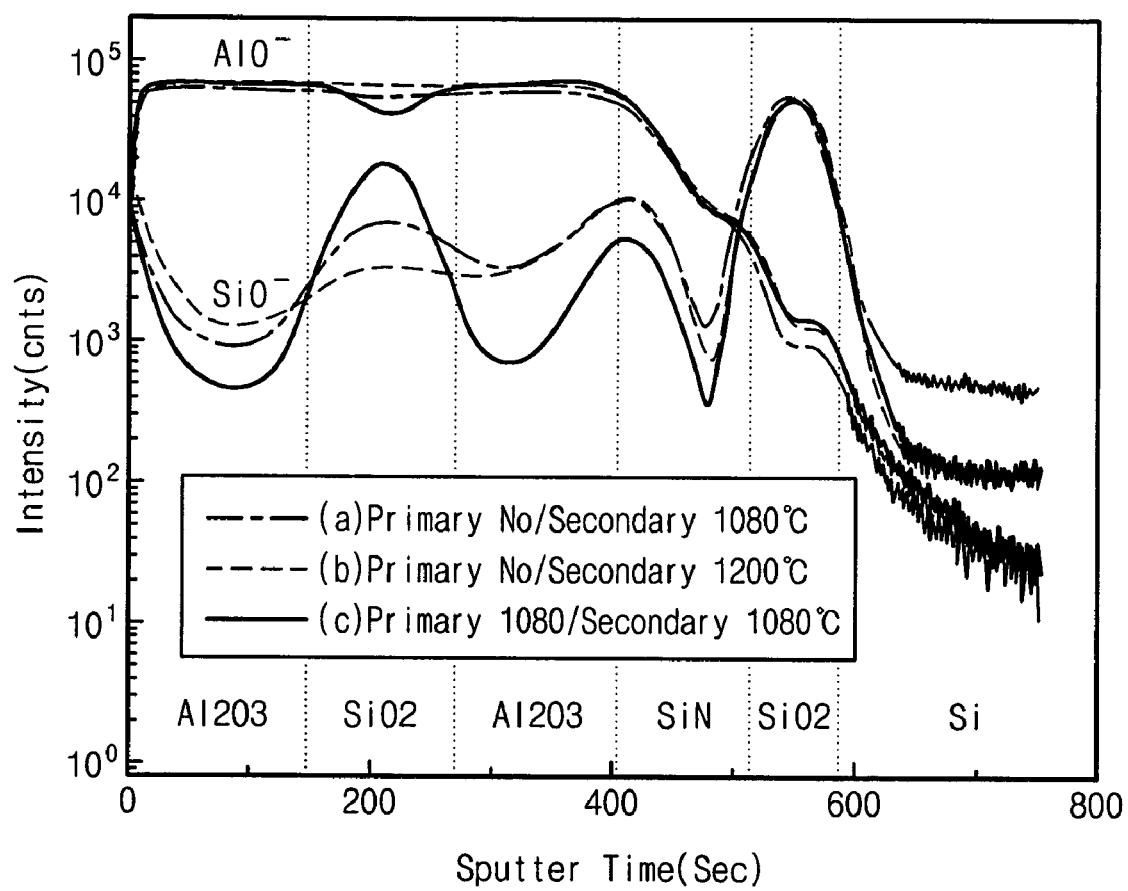
FIG. 11 illustrates a graph of SIMS results of nonvolatile memory devices.

FIG. 11 illustrates a graph of Secondary Ion Mass Spectroscopy (SIMS) results when the tunnel insulating layer 20 was a silicon oxide ($SiO_2$) layer, the charge storage layer 30 was a silicon nitride (SiN) layer, and the dielectric layer 40 was a stack of an aluminum oxide ($Al_2O_3$) layer/a silicon oxide ($SiO_2$) layer/an aluminum oxide ($Al_2O_3$) layer. AlO- and SiO-peaks were observed. When the first postprocess was not performed, i.e., for curves (a) and (b), silicon atoms of the silicon oxide layer 44 diffused into the first aluminum oxide layer 42 and accumulate at an interface between the first aluminum oxide layer 42 and the charge storage layer 30. When the first postprocess was not performed and the second postprocess was performed at a high temperature, i.e., curve (b), diffusion of the silicon atoms was increased to further degrade the interface characteristics. The reason for this is that the thermal load was applied to the first aluminum oxide layer 42 and the silicon oxide layer 44, i.e., after formation of the silicon oxide layer 44, so the first aluminum oxide layer 42 was not crystallized.

When both the first and third postprocesses are performed, i.e., curve (c), diffusion of the silicon atoms of the silicon oxide layer 44 was relatively reduced to improve the interface characteristics. Further, when both the first and third postprocesses were performed at about 1080° C., i.e., curve (c), an SiO-peak intensity was greater in the silicon oxide layer 44 than in an interface between the charge storage layer 30 and the first aluminum oxide layer 42. That is, the diffusion of the silicon atoms was relatively reduced to improve the interface characteristics.

Figure 12:
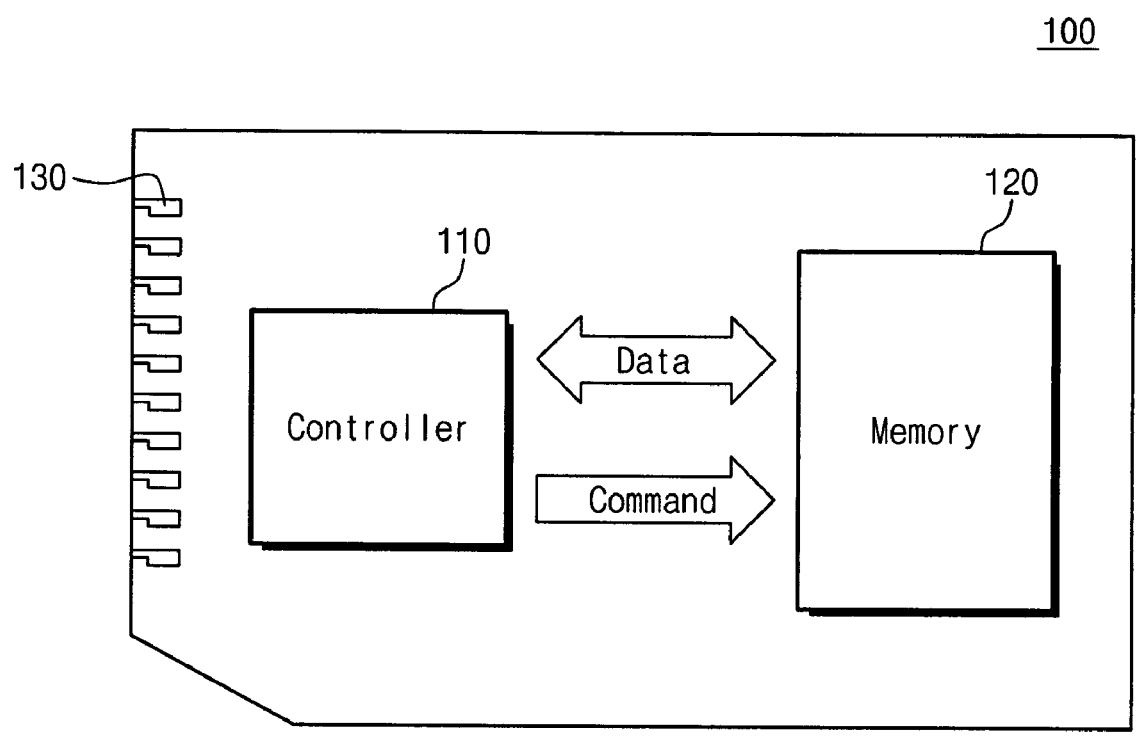
FIG. 12 illustrates a block diagram of a memory card system including a nonvolatile memory device according to example embodiments.

FIG. 12 illustrates a block diagram of a memory card system 100 including a nonvolatile memory device according to example embodiments. Referring to FIG. 12, the memory card system 100 may include a controller 110, a memory 120, and an interface 130. For example, the controller 110 may include one or more microprocessors, digital signal processors, or microcontrollers. For example, the memory 120 may be used to store user data and/or commands executed by the controller 110. The memory 120 may include the nonvolatile memory device 10 described previously with reference to FIGS. 1-2, a nonvolatile random access memory, and/or other types of memories. For example, the memory 120 may include one or more of DRAM, Flash, PRAM, SRAM, and MRAM. The controller 110 and the memory 120 may be configured to exchange the commands and/or the user data. The interface 130 may be used to input/output data with respect to the outside. The memory card system 100 may be a multimedia card (MMC), a secure digital card (SDC), or a portable data storage device.

Figure 13:
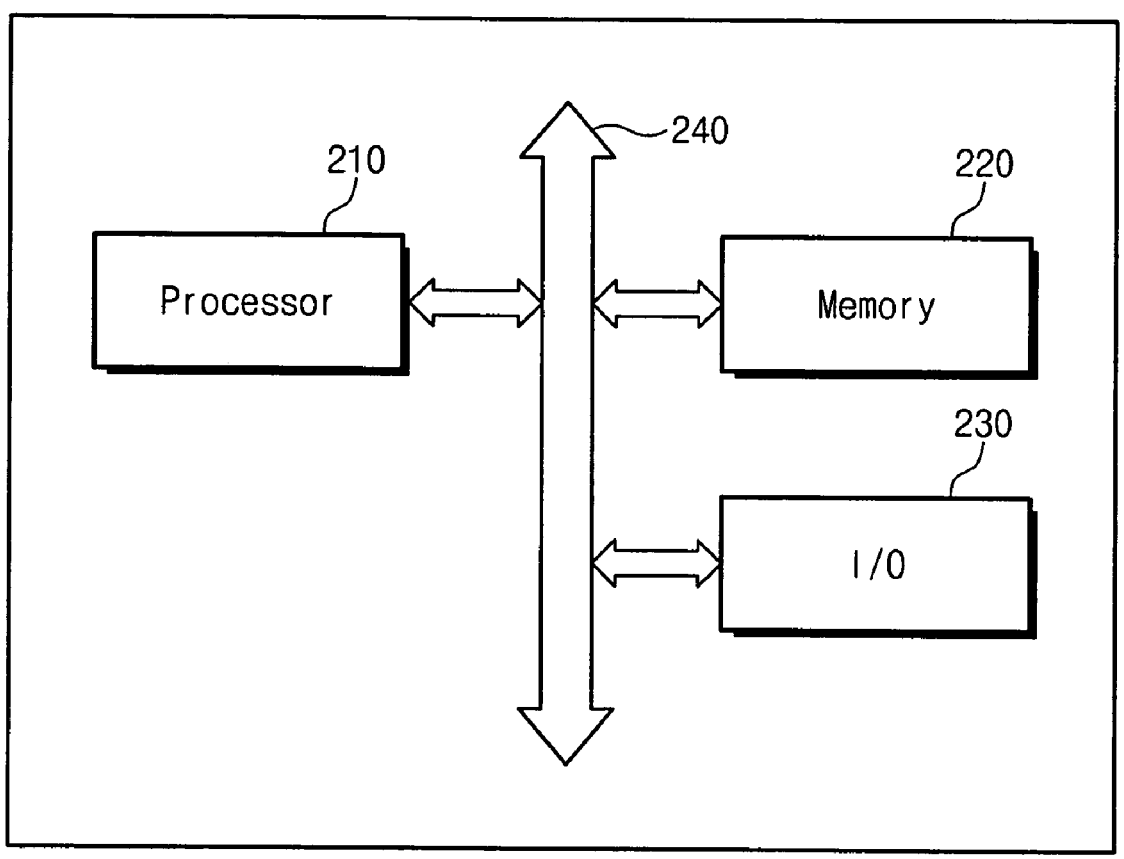
FIG. 13 illustrates a block diagram of an electronic device including a nonvolatile memory device according to example embodiments.

FIG. 13 illustrates a block diagram of an electronic device 200 including a nonvolatile memory device according to example embodiments. Referring to FIG. 13, the electronic device 200 may include a processor 210, a memory 220, and an input/output (I/O) device 230. The processor 210, the memory 220, and the I/O device may be connected through a bus 240. The memory 220 may receive control signals, e.g., RAS*, WE*, and CAS*, from the processor 210, and may be used to store data accessed through the bus 240. The memory 220 may include the nonvolatile memory device 10 according to example embodiments. It is noted that electrical circuits and control signals may be provided according to example embodiments.

The electronic device 200 may be used in, e.g., computer systems, wireless communication devices, PDAs, laptop computers, portable computers, Web tablets, wireless phones, portable phones, digital music players, MP3 players, navigation devices, solid-state disks (SSDs), household appliances, or other wireless data communication devices.

As described above, example embodiments relate to use of a stack of an aluminum oxide layer/a silicon oxide layer/an aluminum oxide layer as a dielectric layer between a charge storage layer and a control gate of a nonvolatile memory. The aluminum oxide layers may be crystallized, so diffusion of silicon atoms of the silicon oxide layer may be controlled, i.e., minimized. Minimized diffusion of silicon atoms from the silicon oxide layer into adjacent aluminum oxide layers may improve interface characteristics between the aluminum oxide layer and respective silicon oxide layer, thereby improving charge storage characteristics of the charge storage layer. Further, the improved interface characteristics may reduce back tunneling of the nonvolatile memory device, thereby improving operation speed thereof.

Exemplary embodiments of the present invention have been disclosed herein, and although specific terms are employed, they are used and are to be interpreted in a generic and descriptive sense only and not for purpose of limitation. Accordingly, it will be understood by those of ordinary skill in the art that various changes in form and details may be made without departing from the spirit and scope of the present invention as set forth in the following claims.

What is claimed is:

1. A method of fabricating a nonvolatile memory device, comprising:
   forming a tunnel insulating layer on a semiconductor substrate;
   forming a charge storage layer on the tunnel insulating layer;
   forming a dielectric layer on the charge storage layer, the dielectric layer including a first aluminum oxide layer, a silicon oxide layer, and a second aluminum oxide layer sequentially stacked on the charge storage layer;
   forming a gate electrode on the dielectric layer, the gate electrode directly contacting the second aluminum oxide layer of the dielectric layer;
   performing a first thermal treatment on the first aluminum oxide layer at a first thermal treatment temperature to form a crystallized first aluminum oxide layer, the thermal treatment being performed before forming the silicon oxide layer on the first aluminum oxide layer; and
   performing a second thermal treatment on the second aluminum oxide layer at a second thermal treatment temperature different from the first thermal treatment temperature to form a crystallized second aluminum oxide layer, the thermal treatment being performed before forming the gate electrode on the second aluminum oxide layer.

2. The method as claimed in claim 1, wherein the second thermal treatment applies a smaller thermal load to the second aluminum oxide layer than a thermal load applied by the first thermal treatment to the first aluminum oxide layer.

3. The method as claimed in claim 2, wherein the first thermal treatment temperature is about 850° C. to about 1350° C., and the second thermal treatment temperature is about 600° C. to about 1300° C.

4. The method as claimed in claim 3, wherein the first thermal treatment temperature is about 1000° C. to about 1300° C., and the second thermal treatment temperature is about 850° C. to about 1100° C.

5. The method as claimed in claim 1, further comprising performing a thermal oxidation process on the silicon oxide layer before forming the second aluminum oxide layer.

6. The method as claimed in claim 5, wherein the thermal oxidation process is performed using at least one of a Rapid Thermal Oxidation (RTO) process, an ultraviolet treatment, and an ozone treatment.

7. The method as claimed in claim 1, wherein the charge storage layer is formed of a nonconductive layer configured to store charges.

8. The method as claimed in claim 1, wherein the charge storage layer is formed to include a charge trap layer, and a portion of the gate electrode contacting the second aluminum oxide layer includes a conductive layer with a work function greater than about 4.0 eV.

9. A method of fabricating a nonvolatile memory device, comprising:
   forming a charge storage layer on a tunnel insulating layer on a semiconductor substrate;
   sequentially forming a first aluminum oxide layer, a silicon oxide layer, and a second aluminum oxide layer on the charge storage layer, the first aluminum oxide layer contacting the charge storage layer; and
   forming a gate electrode on the second aluminum oxide layer, the gate electrode contacting the second aluminum oxide layer;
   performing a first thermal treatment on the first aluminum oxide layer at a first thermal treatment temperature to form a crystallized first aluminum oxide layer, the thermal treatment being performed before forming the silicon oxide layer on the first aluminum oxide layer; and
   performing a second thermal treatment on the second aluminum oxide layer at a second thermal treatment temperature different from the first thermal treatment temperature to form a crystallized second aluminum oxide layer, the thermal treatment being performed before forming the gate electrode on the second aluminum oxide layer,
   wherein the first aluminum oxide layer and the second aluminum oxide layer are thermally treated by the first thermal treatment and the second thermal treatment, respectively, to minimize back tunneling from the gate electrode to the charge storage layer.

* * * * *